United States Patent [19]

Nakayama

[11] Patent Number: 5,703,383

[45] Date of Patent: Dec. 30, 1997

[54] POWER SEMICONDUCTOR DEVICE

[75] Inventor: Kazuya Nakayama, Sagamihara, Japan

[73] Assignee: Kabushiki Kaisha Toshiba, Kawasaki, Japan

[21] Appl. No.: 629,222

[22] Filed: Apr. 8, 1996

[30] Foreign Application Priority Data

Apr. 11, 1995 [JP] Japan .................. 7-085506

[51] Int. Cl.$^6$ .................. H01L 29/74; H01L 29/76; H01L 29/94

[52] U.S. Cl. .................. 257/139; 257/341; 257/401

[58] Field of Search .................. 257/139, 140, 257/147, 151, 341, 408

[56] References Cited

U.S. PATENT DOCUMENTS

| | | | |
|---|---|---|---|
| 4,672,407 | 6/1987 | Nakagawa et al. | 257/341 |
| 4,837,606 | 6/1989 | Goodman et al. | 257/139 |
| 5,285,094 | 2/1994 | Mori et al. | 257/341 |

FOREIGN PATENT DOCUMENTS 63-73670  4/1988  Japan .

Primary Examiner—Wael Fahmy
Attorney, Agent, or Firm—Oblon, Spivak, McClelland, Maier & Neustadt, P.C.

[57] ABSTRACT

A power semiconductor device comprises a plurality of IGBT's, and gate electrodes and source electrodes are alternately arranged. In two adjacent IGBT's, the gate electrode is positioned between two source electrodes, and in the next two adjacent IGBT's, the source electrode is positioned between two gate electrodes. The power semiconductor device is designed to meet conditions of $60\ \mu m \leq L_G$, $5 \leq L_G/L_S$, and $1 \leq L_G^2/(D_B \cdot W_B) \leq 9$, where $L_G$ denotes the width of the gate electrode, $D_B$ denotes the depth of the base layer of the first conductivity type, $W_B$ denotes the thickness of that portion of the base layer of the second conductivity type which is sandwiched between the base layer of the first conductivity type and the emitter layer of the first conductivity type, and $L_S$ denotes the distance between these gate electrodes.

21 Claims, 6 Drawing Sheets

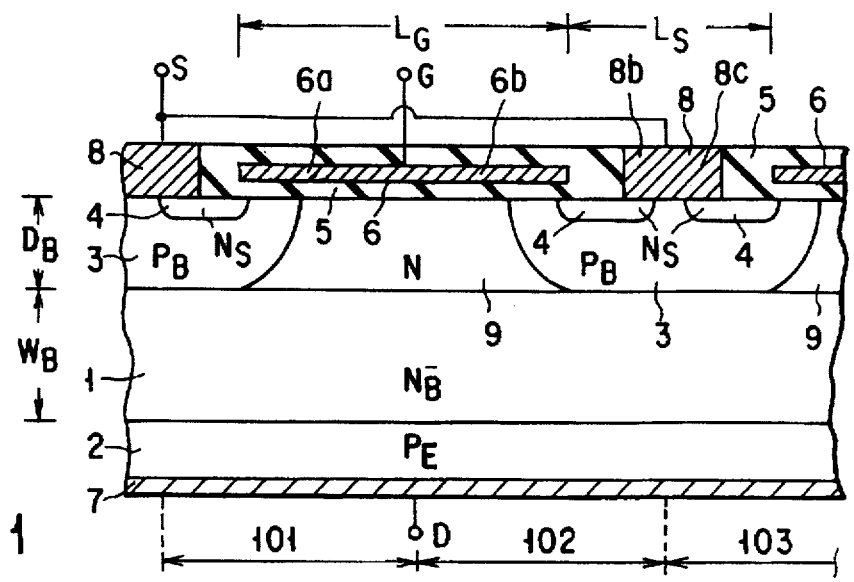
F I G. 1
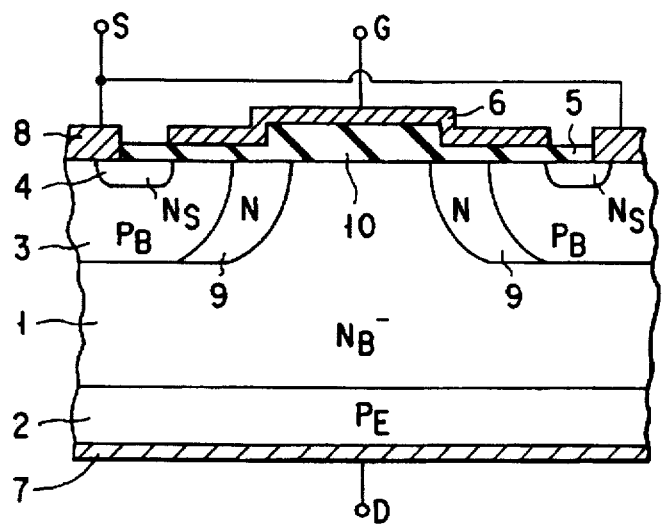
F I G. 2
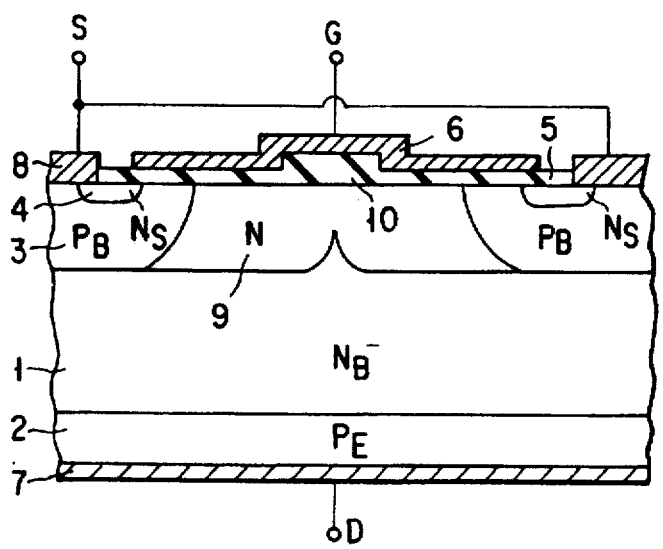
F I G. 3

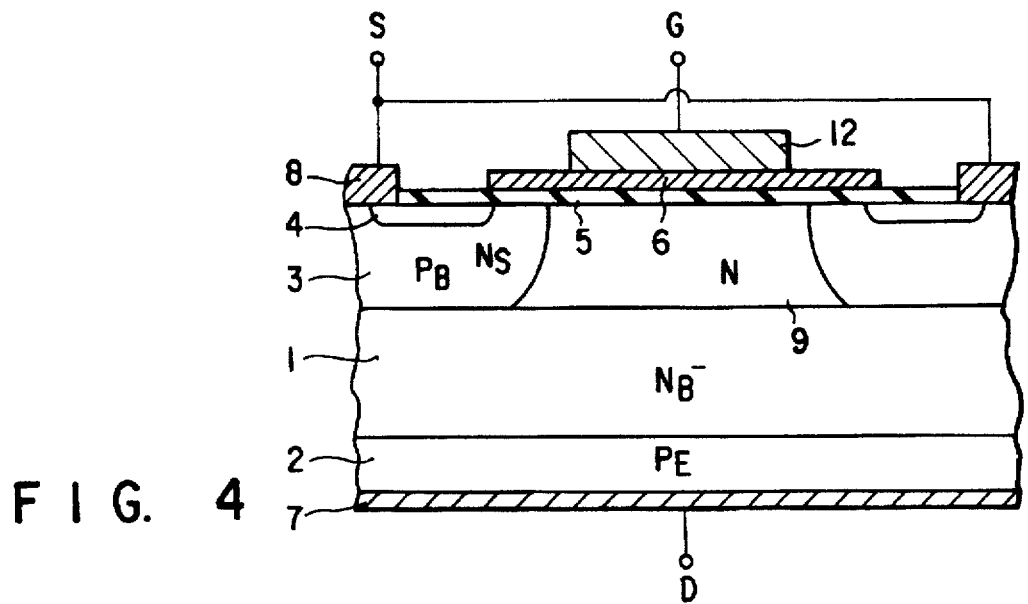
F I G. 4
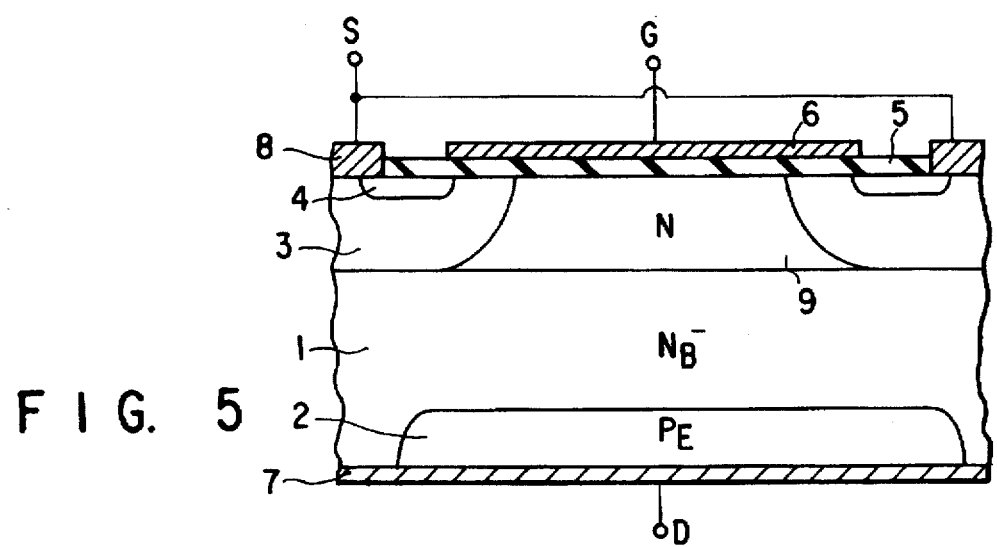
F I G. 5
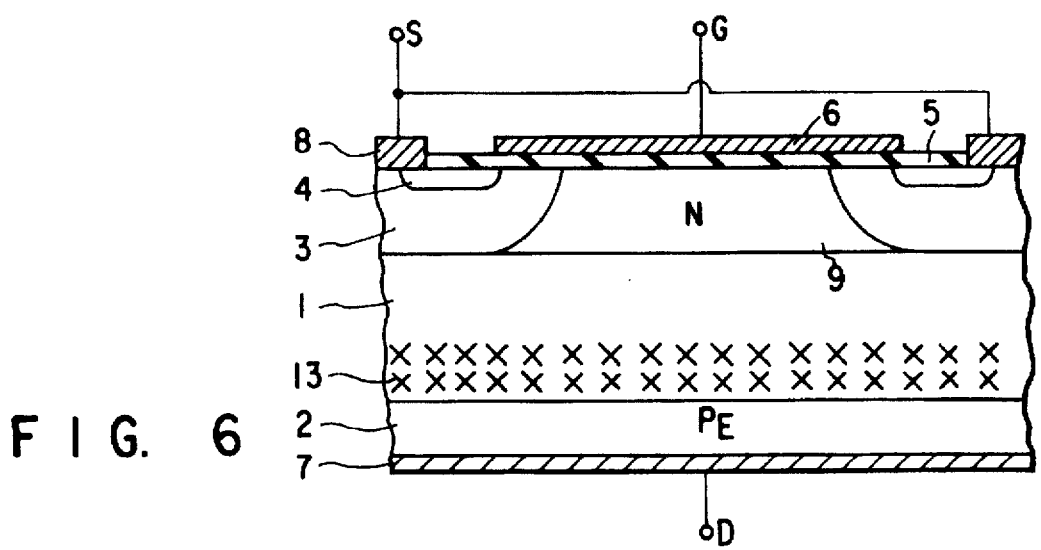
F I G. 6

POWER SEMICONDUCTOR DEVICE

BACKGROUND OF THE INVENTION

1. Field of the Invention

The present invention relates to a power semiconductor device for controlling a large electric power.

2. Description of the Related Art

An insulated gate bipolar transistor (IGBT) is known as a semiconductor circuit element for a power control. The IGBT is a new circuit element exhibiting both high switching properties of a power MOSFET and high output properties of a bipolar transistor and, therefore, is widely used in recent years in the field of a power electronics such as an inverter and a switching power source.

FIG. 18 is a cross sectional view showing a conventional IGBT. As shown in the drawing, a P-type base layer 83 is selectively formed in a surface of a N-type base layer 81 having a high resistivity. An N-type source region 84 having a low resistivity is selectively formed in a surface of the P-type base region 83. A gate electrode 86 is formed on that region of the P-type base layer 83 which is interposed between the N-type source layer 84 and the N-type base layer 81 such that a gate insulating film 85 is interposed between the gate electrode 86 and the P-type base layer 83. The gate electrode portions of two adjacent IGBT are made integral to form the gate electrode 86. Further, an N-type source electrode 88 is formed in contact with both an N-type source layer 84 and a P-type base layer 83. Still further, a drain electrode 87 is formed on a P-type emitter layer 82.

The IGBT of the construction described above is operated as follows. Specifically, when the transistor is turned on, a voltage which is positive relative to the source electrode 88, i.e., positive bias voltage, is applied to the gate electrode 86. If a positive bias voltage is applied to the gate electrode 86, an N-channel is formed in a surface of the P-type base layer 83 positioned below the gate electrode 86. As a result, a short-circuiting takes place between the N-type source layer 84 and the N-type base layer 81. The short-circuiting causes electrons to be injected from the N-type source layer 84 into the N-type base layer 81, thereby forming an electron current. At the same time, holes are injected from the P-type emitter layer 82 into the N-type base layer 81 in an amount corresponding to the electron current. As a result, the resistivity of the N-type base layer 81 is lowered because of occurrence of conductivity modulation in the base layer 81, thereby causing a main current to flow between the source and drain regions.

When the IGBT is turned off, a voltage which is zero or negative, i.e., negative bias voltage, relative to the source electrode 88 is applied to the gate electrode 85. With this operation, the N-channel disappears and, thus, electrons cease to be injected from the N-type emitter layer 84 into the N-type base layer 81. As a result, the conductivity modulation does not take place in the N-type base layer 81, causing the IGBT to be rendered non-conductive.

The conventional IGBT shown in FIG. 18 gives rise to serious problems as described below. Specifically, the carrier (electron) injection from the cathode (source) side is smaller in the IGBT, compared with a thyristor, with the result that the on-voltage for the IGBT is rendered high. Since the substrate is made thicker with increase in the withstand voltage, the on-voltage is rendered high. Where the substrate thickness is increased to reach a certain level, the on-voltage is rendered markedly high, leading to a large power loss. To overcome this difficulty, the withstand voltage is set at only about 2 kV in the conventional IGBT. Further, the distance between adjacent gate electrodes is roughly equal to the width of the gate electrode. This brings about a large saturation current which causes the IGBT to be apt to latch up and be uncontrollable.

SUMMARY OF THE INVENTION

An object of the present invention is to provide a power semiconductor device which permits lowering the on-voltage.

Another object is to provide a power semiconductor device with improvements in the on-voltage, safe operating range, and latch-up current.

Still another object is to provide a power semiconductor device of a high withstand voltage, i.e., a device capable of withstanding a voltage of, for example, 3 kV or more. According to a first aspect of the present invention, there is provided a power semiconductor device having a plurality of circuit elements arranged side by side, each circuit element comprising:

an emitter layer of a first conductivity type;

a base layer of a second conductivity type arranged on the emitter layer;

a base layer of the first conductivity type formed in a surface of the base layer of the second conductivity type;

a source layer of the second conductivity type formed in a surface of the base layer of the first conductivity type;

a gate electrode portion arranged via a gate insulating film on the base layer of the first conductivity type sandwiched between the source layer of the second conductivity type and the base layer of the second conductivity type;

a source electrode portion arranged to be in contact with both the source layer of the second conductivity type and the base layer of the first conductivity type; and a drain electrode portion arranged to be in contact with the emitter layer of the first conductivity type, wherein the gate electrode portions of adjacent two of the circuit elements are made integral to constitute a gate electrode, and conditions of 60 $\mu m < L_G$, $5 < L_G/L_S$ and $1 < L_G^2/(D_B \cdot W_B) \leq 9$ are satisfied, where $L_B$ denotes a width of the gate electrode, $D_B$ denotes a depth of the base layer of the first conductivity type, $W_B$ denotes a thickness of the base layer of the second conductivity type, which is sandwiched between the base layer of the first conductivity type and the emitter layer of the first conductivity type, and $L_S$ denotes a distance between adjacent two of the gate electrodes.

According to a second aspect of the present invention, there is provided a power semiconductor device having a plurality of circuit elements arranged side by side, each circuit element comprising:

an emitter layer of a first conductivity type;

a base layer of a second conductivity type arranged on the emitter layer;

a base layer of the first conductivity type formed in a surface of the base layer of the second conductivity type;

a source layer of the second conductivity type formed in a surface of the base layer of the first conductivity type;

a gate electrode portion arranged via a gate insulating film on the base layer of the first conductivity type sandwiched between the source layer of the second conductivity type and the base layer of the second conductivity type;

a source electrode portion arranged to be in contact with both the source layer of the second conductivity type and the base layer of the first conductivity type;

a drain electrode portion arranged to be in contact with the emitter layer of the first conductivity type, and a semiconductor layer of a high mobility formed in a surface of the base layer of the first conductivity type sandwiched between the base layer of the second conductivity type and the source layer of the second conductivity type.

The peak value of the impurity concentration in the semiconductor layer of the second conductivity type having a low resistivity should be at least $3\times10^{14}$ cm$^{-3}$ and, preferably, $1\times10^{15}$ cm$^{-3}$ or more. Also, the depth (thickness) of the semiconductor layer of the second conductivity type having a low resistivity should be at least ½ of the depth (thickness) of the base layer of the first conductivity type and, preferably, equal to the depth (thickness) of the base layer of the first conductivity type.

The present inventor has found that the on-voltage can be lowered, under conditions of 60 µm$\leq L_G$, and $1 \leq L_G^2/(D_B \cdot W_B) \leq 9$. It has also been found that the saturation current can become smaller than the latch-up current without increase in the on-voltage so that a safe operation range can be enlarged, under a condition of $5 \leq _G/L_S$. In this respect, the fine processing technology which has been developed in recent years has made it possible to render $L_G$ sufficiently smaller than $L_S$, i.e., $5 \leq L_G/L_S$. It follows that the semiconductor device according to the first aspect of the present invention permits lowering the on-voltage and enlarging the safe operation range, compared with the prior art.

In the semiconductor device according to the second aspect of the present invention, the carrier on the source side is injected into the base layer of the first conductivity type through the semiconductor layer of a high mobility, with the result that the carrier is injected into the base layer of the first conductivity type more rapidly than in the prior art. It follows that the amount of carriers injected per unit time into the base layer of the first conductivity type is markedly increased, leading to a high carrier injection efficiency. As a result, the on-voltage can be lowered, compared with the prior art.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view showing a gist part of a power semiconductor device according to an embodiment of the present invention;

FIG. 2 is a cross sectional view showing a gist part of a power semiconductor device according to another embodiment of the present invention;

FIG. 3 is a cross sectional view showing a gist part of a power semiconductor device according to still another embodiment of the present invention;

FIG. 4 is a cross sectional view showing a gist part of a power semiconductor device according to still another embodiment of the present invention;

FIG. 5 is a cross sectional view showing a gist part of a power semiconductor device according to still another embodiment of the present invention;

FIG. 6 is a cross sectional view showing a gist part of a power semiconductor device according to still another embodiment of the present invention;

DETAILED DESCRIPTION OF THE PREFERRED EMBODIMENTS

Figure 7:
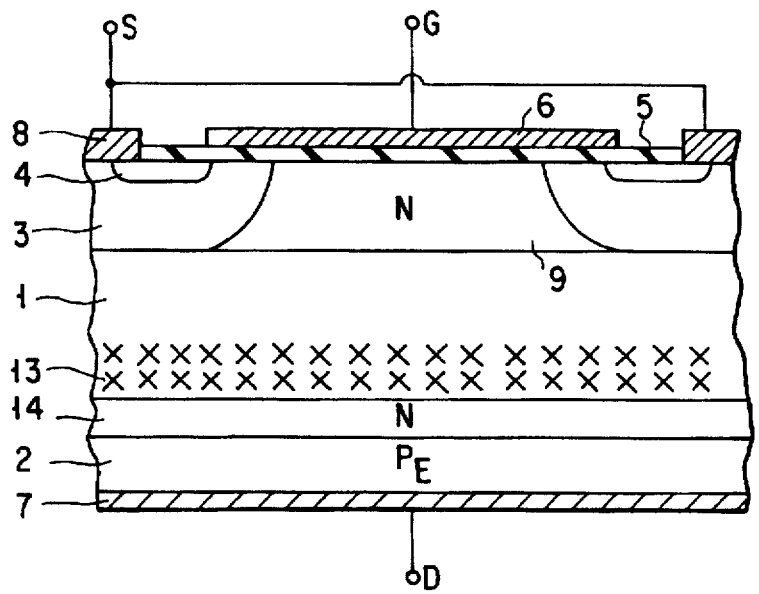
FIG. 7 is a cross sectional view showing a gist part of a power semiconductor device according to still another embodiment of the present invention.

Let us describe some embodiments of the present invention with reference to the accompanying drawings. In the following description, a first conductivity type is P-type, and a second conductivity type is N-type.

Specifically, FIG. 1 is a cross sectional view showing a gist part, i.e., IGBT (insulated gate bipolar transistor) section, of a power semiconductor device according to an embodiment of the present invention. The power semiconductor device of this embodiment comprises a plurality of IGBT's (circuit elements) 101, 102, 103, etc., which are arranged side by side. The gate electrodes 6 and the source electrodes 8 of these IGBT's are alternately arranged. As shown in FIG. 1, a gate electrode portion 6b included in the IGBT 102 and another gate electrode portion 6a included in the adjacent IGBT 101 on the left side in the drawing collectively form a gate electrode 6. Likewise, a source electrode portion 8b included the IGBT 102 and another source electrode portion 8a included in the adjacent IGBT 103 on the right side in the drawing collectively form a source electrode 8. It follows that, when it comes to the adjacent IGBT's 101 and 102, the gate electrode 6 is positioned between the source electrode 8 of the IGBT 101 and the source electrode 8 of the IGBT 102. Likewise, when it comes to the adjacent IGBT's 102 and 103, the source electrode 8 is positioned between the gate electrode 6 of the IGBT 102 and the gate electrode 6 of the IGBT 103.

As shown in FIG. 1, a P-type emitter layer 2 is selectively formed on a bottom surface of an N-type base layer 1 having a high resistivity. An N-type diffusion layer 9 having a low resistivity is formed in a top surface of the N-type base layer 1. Further, a P-type base layer 3 is selectively formed in a surface of the N-type diffusion layer 9. In other words, the N-type base layer 9 having a low resistivity is formed in a surface of the N-type base layer 1 right under the gate electrode 6 positioned between the two adjacent P-type base layers 3.

It is desirable for the depth of the N-type diffusion layer 9 having a low resistivity to be equal to that of the P-type base layer 3, as shown in FIG. 1, though it is acceptable for the depth of the N-type diffusion layer 9 to be at least ½ of the depth of the P-type base layer 3.

An N-type source layer 4 having a low resistivity is selectively formed in a surface of the P-type base layer 3. The gate electrode is arranged via a gate insulating film 5 on the surface of that portion of the P-type base layer 3 which is sandwiched between the N-type source layer 4 and the N-type base layer 1 (N-type diffusion layer 9). Further, the source electrode 8 is arranged to be in contact with both the N-type source layer 4 and the P-type base layer 3.

The gate electrode 6 indicated in a central portion of FIG. 1 functions as the gate electrodes of both the IGBT's 101 and 102. To be more specific, the gate electrode portions 6a and 6b included in the IGBT's 101 and 102, respectively, extend through the P-type base layer 3 to reach the N-type base layer 1 (N-type diffusion layer 9) so as to be made integral.

On the other hand, a drain electrode 7 is arranged to be in contact with the P-type emitter layer 2.

In the power semiconductor device of the construction described above, the N-type diffusion layer 9 promotes an electron injection, making it possible lower the on-voltage of the device.

It is desirable for the peak value of the impurity concentration in the N-type diffusion layer 9 to be at least $3 \times 10^{14} \text{cm}^{-3}$. Particularly, when it comes to an N-channel type IGBT like the device shown in FIG. 1, it is desirable for the peak value noted above to be at least $1 \times 10^{15} \text{ cm}^{-3}$. Further, the impurity concentration in the N-type diffusion layer 9 must not exceed the peak value of the impurity concentration in the P-type base layer 3 right under the N-type source layer 4.

The value of $1 \times 10^{15} \text{ cm}^{-3}$ noted above is obtained as follows.

Specifically, the hole density $n_h$ inside the N-type base layer 1 can be represented by the equation given below:

$$n_h = N_p \cdot \exp(W_B/(D_h \cdot \tau)^{1/2})$$

where:

$N_p$ denotes a peak value of the impurity concentration in the P-type emitter layer 2;

$W_B$ denotes the thickness of that portion of the N-type base layer 1 which is sandwiched between the P-type base layer 3 and the P-type emitter layer 2;

$D_h$ denotes the hole diffusion coefficient; and $\tau$ denotes a carrier life time under a high injection state.

If the peak value of the impurity concentration in the N-type diffusion layer 9 is not higher than the hole density $n_h$, the entire region of the N-type diffusion layer 9 is rendered replete with holes. It follows that, where the peak value of the impurity concentration in the N-type diffusion layer 9 is smaller than the hole density $n_h$, the carrier injection cannot be achieved sufficiently, making it difficult to improve the conducting characteristics of the IGBT.

On the other hand, where the peak value of the impurity concentration in the N-type diffusion layer 9 is higher than the hole density $n_h$, the N-type diffusion layer 9 acts as an emitter with respect to the holes, with the result that the electron injection efficiency is improved. When calculated by the equation given above, obtained is the value of about $1 \times 10^{15} \text{ cm}^{-3}$ noted above, where each of the parameters is determined to be essentially one value, depending on the construction of the semiconductor device and the conditions under which the semiconductor device is used.

When it comes a P-channel type IGBT, the N-type diffusion layer 9 having a low resistivity is replaced by a P-type diffusion layer having a low resistivity. In this case, the peak value of the impurity concentration in the P-type diffusion layer should desirably be at least $3 \times 10^{14} \text{ cm}^{-3}$.

The width $L_G$ of the gate electrode 6 constitutes an important parameter in determining the conducting characteristics of the IGBT. If the width $L_G$ of the gate electrode 6 is unduly long, the carrier density in the channel region of the IGBT is lowered, with the result that the conducting characteristics are rendered poor. In addition, various other problems are likely to take place such as increases in the gate capacitance and cost, and deterioration in the control capability.

On the other hand, if the width $L_G$ of the gate electrode 6 is unduly short, the holes injected from the P-type drain layer 2 are bypassed into the P-type base layer 3, resulting in failure to be accumulated in the N-type base layer 1 having a high resistivity. Naturally, the conducting characteristics are impaired in this case, too.

The present inventor has found that, in order to improve the channel density and the carrier accumulation so as to lower the on-voltage of the semiconductor device, it is necessary to set the width $L_G$ of the gate electrode 6 to meet the inequality given below regardless of the presence of the N-type diffusion layer 9:

$$1 \leq L_G^2/(D_B \cdot W_B)$$

where $D_B$ denotes the depth of the P-type base layer 3.

The inequality given above is obtained as follows:

The current density i of the IGBT under a condition of the conductivity modulation is:

$$i = q \cdot n \cdot V_F (\mu_e + \mu_h)/W_B \quad (1)$$

where q denotes an elementary charge, n denotes the density of carrier (electron or hole), $V_F$ denotes an on-voltage, $\mu_e$ denotes the electron mobility, and $\mu_h$ denotes the hole mobility.

The effective sheet resistance R of the P-type base layer 3 during conduction is:

$$R = 1/(q \cdot \mu_h \cdot n \cdot D_B) \quad (2)$$

Since it suffices for the voltage drop of the hole current, caused by the sheet resistance R, to be equal to or higher than the junction voltage $V_j$, an inequality given below should be met:

$$i \cdot R \cdot L_G^2 / 32 \geq V_j \qquad (3)$$

From formulas (1) to (3):

$$L_G^2/(D_B \cdot W_B) \geq 32 V_j \cdot \mu_h/(V_F(\mu_e + \mu_h)) \qquad (4)$$

Where silicon is used as a semiconductor material, $\mu_h/(\mu_e + \mu_h)$ is about 0.25, $V_j$ is about 0.6 V. In the general operation of a power semiconductor device, the on-voltage $V_F$ is about 4 V. Therefore, formula (4) can be rewritten as:

$$1 \leq L_G^2/(D_B \cdot W_B)$$

Figure 10:
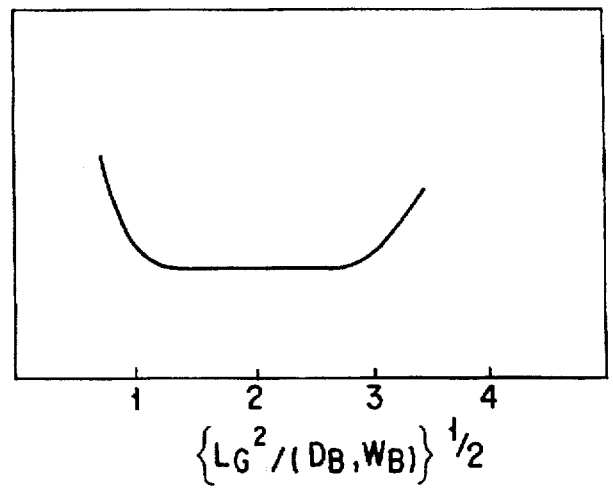
FIG. 10 is a graph showing the on-voltage $V_F$ relative to the values of $(L_G^2/(D_B \cdot W_B))^{1/2}$.

If the value of $L_G^2/(D_B \cdot W_B)$ is unduly large, the channel is decreased so as to deteriorate the conducting properties of the device, as seen from FIG. 10. According to the data given in FIG. 10, it is necessary to set $L_G^2/(D_B \cdot W_B)$ at a value not exceeding 9 in order to prevent the channel reduction. In other words, it is desirable to set the following condition to be satisfied:

$$1 \leq L_G^2/(D_B \cdot W_B) \leq 9$$

It should also be noted that, if the width $L_G$ of the gate electrode is unduly short, the holes tend to be easily bypassed, with the result that the carriers are unlikely to be accumulated. Particularly, where the withstand voltage of the semiconductor device exceeds 3 kV, the bypassing of the holes noted above constitutes a decisive defect in terms of the conducting properties. The present inventor has experimentally confirmed that, if the value of $L_G$ is at least about 60 μm, the carrier accumulation is caused to take place under the conditions given above. The present inventor has also confirmed experimentally that a latch-up phenomenon is unlikely to take place under a condition of $2 \leq L_G/S_G$, preferably $5 \leq L_G/S_G$, where $L_S$ denotes the distance between adjacent gate electrodes 6. This denotes that the semiconductor device exhibits a high resistance to destruction, and permits enlarging a safe operation range so as to make it possible to simplify the protecting circuit.

The embodiment shown in FIG. 1 differs from the prior art in that $L_G$ is considerably larger than $L_S$, with the result that the saturation current can become smaller than the latch-up current. It is impossible to make $L_G$ considerably larger than $L_S$ by the conventional process technology which is employed in many cases for producing semiconductor elements such as an IGBT. However, the particular design as in the present invention can be achieved by the fine processing technology such as steppers whose progress is prominent in recent years.

In the embodiment shown in FIG. 1, the improvements in on-voltage and safe operating range are achieved by making the various parameters optimum. Therefore, a new construction need not be introduced. Naturally, the number of process steps need not be increased. Also, the manufacturing process is not rendered complex. It follows that the manufacturing cost is not increased.

FIG. 2 is a cross sectional view showing a gist part, i.e., an IGBT area, of a power semiconductor device according to another embodiment of the present invention. The reference numerals used commonly in FIG. 1 and the following drawings denote the same members and, thus, the explanation thereof is omitted in the following description.

The embodiment shown in FIG. 2 is featured in that the gate oxide film 5 includes a central portion 10 which is thicker than the other portion. The particular construction as shown in FIG. 2 lowers the gate capacitance to so as to make it possible to simplify the gate driving circuit and to increase the operating speed of the device.

It is desirable to form the N-type diffusion layer 9 uniformly over the entire region below the gate electrode 6, as shown in FIG. 1. Where various process restrictions make it difficult to form the N-type diffusion layer 9 as shown in FIG. 1, however, the N-type diffusion layer 9 can be formed as shown in FIG. 2. To be more specific, the diffusion layer 9 may not be positioned below the central portion of the gate electrode 6, and may be formed in only the vicinity of the N-channel region. Of course, the on-voltage can be lowered in the semiconductor device shown in FIG. 2.

FIG. 3 is a cross sectional view showing a gist part, i.e., an IGBT area, of a power semiconductor device according to still another embodiment of the present invention.

The embodiment shown in FIG. 3 differs from the embodiment of FIG. 2 in that, in FIG. 3, the N-type diffusion layer 9 is formed over the entire region below the gate electrode 6. However, the embodiment of FIG. 3 differs from the embodiment of FIG. 1 in that the N-type diffusion layer 9 in FIG. 3 is not uniform. To be more specific, the N-type diffusion layer 9 shown in FIG. 3 includes a central portion which is thinner than the other portion.

The particular construction shown in FIG. 3 can be obtained as follows. Specifically, the width of the central portion 10 of the gate insulating film 5 is made smaller. Then, an N-type impurity is introduced into the substrate by ion implantation, with the gate insulating film 5 used as a mask, followed by applying a heat treatment (annealing treatment). In this case, the N-type impurity is diffused to reach a region right under the central portion 10 of the gate insulating film to form the N-type diffusion layer 9 over the entire region below the gate electrode 6.

In the embodiment shown in FIG. 3, its gate capacitance is somewhat larger than that of the embodiment of FIG. 2 because the width of the thick central portion 10 of the gate insulating film 5 is shorter in FIG. 3 than in FIG. 2. However, the present inventor has experimentally confirmed that the conducting properties of the device shown in FIG. 3 can be improved where the N-type diffusion layer 9 is formed to cover the entire region below the gate electrode 6.

FIG. 4 is a cross sectional view showing a gist part, i.e., an IGBT area, of a power semiconductor device according to still another embodiment of the present invention.

In order to ensure a high withstand voltage, e.g., a withstand voltage of 2 kV or more, it is necessary to set the width $L_G$ of the gate electrode 6 at 30 μm or more. Likewise, for ensuring a withstand voltage of 3 kV or more, it is necessary to set the width $L_G$ of the gate electrode 6 at 60 μμm more. Since the area of the gate electrode 6 is increased in this fashion, a metal electrode 12 such as an Al electrode can be formed easily on the gate electrode 6, as shown in FIG. 4.

It follows that the gate resistance can be lowered by forming the metal electrode 12 on the gate electrode 6, though it was customary in the past to use polycrystalline silicon alone for forming the gate electrode 6, making it possible to achieve a high speed operation of the semiconductor device.

FIG. 5 is a cross sectional view showing a gist part, i.e., an IGBT area, of a power semiconductor device according to still another embodiment of the present invention.

The embodiment shown in FIG. 5 differs from the embodiment of FIG. 1 in that, in FIG. 5, the N-type base layer 1 is selectively connected to the drain electrode 7. In other words, an anode short circuit structure is employed in the embodiment of FIG. 5.

In this embodiment, the anode short circuit structure makes it possible to suppress the hole injection from the drain side, so that the tail current can be diminished in the turn-off step and the turn-off loss is decreased. As a result, the power loss can be diminished even if the switching frequency is increased, making it possible to operate, for example, an inverter efficiently. Further, since the switching frequency is increased, noise can be suppressed.

What should also be noted is that, even if the anode short circuit structure employed in the embodiment of FIG. 5 causes the carrier injection efficiency from the drain side to be lowered, the on-voltage of the semiconductor device can be maintained at a low level because the carrier injection efficiency from the source side is made higher than in the past by the use of optimum values of parameters and by the presence of the N-type diffusion layer 9.

FIG. 6 is a cross sectional view showing a gist part, i.e., an IGBT area, of a power semiconductor device according to still another embodiment of the present invention.

The embodiment shown in FIG. 6 differs from the embodiment of FIG. 1 in that, in FIG. 6, a life-time lowering layer 13 is further included in the device. The life-time lowering layer 13 can be formed by diffusion of a heavy metal, such as Au, Pt or the like, or by irradiation with radiation, such as H, He or the like. The life-time lowering layer 13 may be formed by combining such a method with another life-time lowering method using electron radiation. Particularly, if the life-time lowering layer 13 is formed within the N-type base layer 1 near the boundary between the P-type emitter layer 2 and the N-type base layer 1 as shown in FIG. 6, the hole injection from the drain side can be effectively suppressed. It follows that the effects similar to those obtained from the embodiment of FIG. 5, which employs the anode short circuit structure, can also be obtained from the embodiment of FIG. 6.

FIG. 7 is a cross sectional view showing a gist part, i.e., an IGBT area, of a power semiconductor device according to still another embodiment of the present invention.

The embodiment shown in FIG. 7 differs from the embodiment of FIG. 6 in that, in FIG. 7, an N-type buffer layer 14 of a low resistivity is formed between the P-type emitter layer 2 and the N-type base layer 1 of a high resistivity. Since the N-type buffer layer 14 is formed, the N-type base layer 1 can be made thinner. As a result, the carrier discharge in the switching step can be promoted, making it possible to achieve a high speed switching. It is desirable to set the impurity concentration in the N-type buffer layer at $1 \times 10^{14}$ cm$^{-2}$ or lower. If the impurity concentration is higher than the level noted above, the hole injection from the drain is markedly suppressed, leading to poor conducting characteristics of the device.

Further, the life-time shortening layer 13 is formed within the N-type base layer 1 in the vicinity of the boundary between the N-type buffer layer 14 and the N-type base layer 1. As a result, the hole injection from the drain side can be suppressed so as to lower the switching loss without noticeably deteriorating the conducting properties of the device. Further, a high speed switching can be performed.

Figure 8:
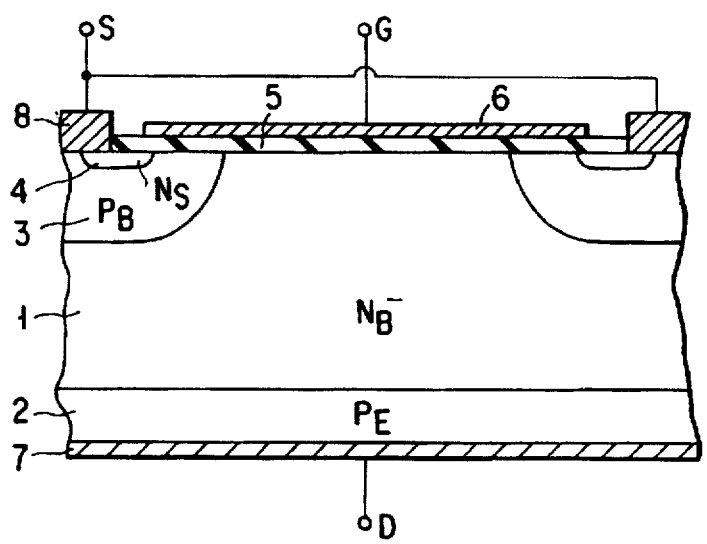
FIG. 8 is a cross sectional view showing a gist part of a power semiconductor device according to still another embodiment of the present invention.

FIG. 8 is a cross sectional view showing a gist part, i.e., an IGBT area, of a power semiconductor device according to still another embodiment of the present invention.

The embodiment shown in FIG. 8 differs from the embodiment of FIG. 1 in that, in FIG. 8, the N-type diffusion layer 9 having a low resistivity is not formed under the gate electrode 6. Even if the N-type diffusion layer 9 is not formed, it is possible to improve the on-voltage, safe operation range and latch-up current of the device by designing the device to meet conditions of $1 \leq L_G^2/(D_B \cdot W_B) \leq 9$ and $2 \leq L_G/L_S$, preferably, $5 \leq L_G/L_S$.

Figure 9:
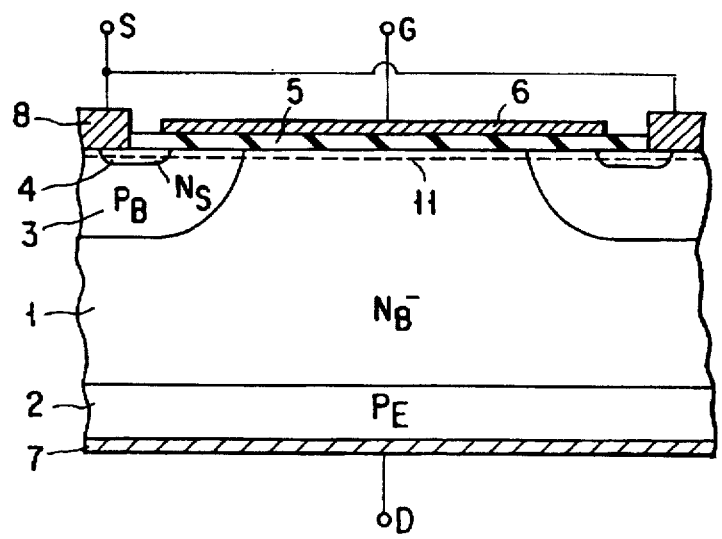
FIG. 9 is a cross sectional view showing a gist part of a power semiconductor device according to still another embodiment of the present invention.

FIG. 9 is a cross sectional view showing a gist part, i.e., an IGBT area, of a power semiconductor device according to still another embodiment of the present invention.

The embodiment shown in FIG. 9 differs from the embodiments of FIGS. 1 to 8 in that, in FIG. 9, a high mobility semiconductor layer 11 is used in place of making the parameters optimum or forming the N-type diffusion layer 9 of a low resistivity so as to increase the electron injection from the source side and, thus, to lower the on-voltage.

The high mobility semiconductor layer 11 is formed in advance in a surface of the N-type base layer 1 by a film forming method such as an epitaxial growth method before the steps of forming the P-type base layer 3, the N-type source layer 4, etc.

Where the N-type base layer 1 is formed of, for example, silicon, the high mobility semiconductor layer 11 is formed of, for example, SiGe, amorphous Si or SiC.

In the embodiment of FIG. 9, the presence of the high mobility semiconductor layer 11 within the N-channel region causes the electrons on the source side to be injected through the high mobility semiconductor layer 11 into the N-type base layer 1. As a result, electrons can be injected into the N-type base layer 1 more rapidly than in the past. In other words, the amount of electrons injected into the N-type base layer 1 in a unit time is increased so as to improve the electron injection efficiency and, thus, to lower the on-voltage.

In the embodiment of FIG. 9, the high mobility semiconductor layer 11 is formed in an entire surface of the N-type base layer 1. However, it suffices for the high mobility semiconductor layer 11 to be formed in at least the N-channel region, i.e., in a surface of the P-type base layer 3 interposed between the N-type source layer 4 and the N-type base layer 1. Also, it is desirable for the impurity concentration within the high mobility semiconductor layer 11 to be lower than $1 \times 10^{18}$ cm$^{-3}$ for the channel formation. Further, the thickness of the high mobility semiconductor layer 11 should desirably be 0.05 μm or less in view of the problem such as a lattice misalignment.

Incidentally, in the case of forming the high mobility semiconductor layer 11, if the device is further designed to meet the above-noted conditions of $1 \leq L_G^2/(D_B \cdot W_B) \leq 9$ and $2 \leq L_G/L_S$, preferably, $5 \leq L_G/L_S$, it is possible to further improve the on-voltage, and to prevent the IGBT from causing latch-up, thereby enlarging the safe operation range.

FIGS. 11 to 16 are plan views each showing the layout of the power semiconductor device of the present invention. The layout shown in each of these drawings can be used in combination with the cross section shown in any of FIGS. 1 to 9. It follows that, in the case where the N-type diffusion layer 9 of a low resistivity is not included in the device as in the embodiments of FIGS. 8 and 9, the region denoted by a reference numeral 9 in each of FIGS. 11 to 16 should be interpreted to denote the N-type base layer 1 having a high resistivity.

Figure 11:
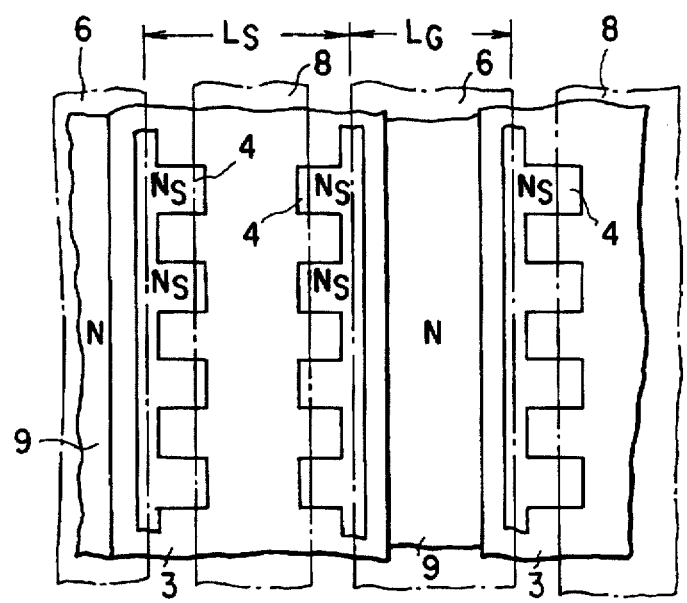
FIG. 11 is a plan view showing a gist part of a power semiconductor device according to still another embodiment of the present invention.

To be more specific, FIG. 11 is a plan view showing a gist part, i.e., an IGBT area, of a power semiconductor device according to still another embodiment of the present invention.

The embodiment shown in FIG. 11 is featured in that the N-type source layer 4 is formed in a comb shape. It should be noted that the slender portions of the N-type source layer 4 corresponding to the teeth of the comb are in contact with the source electrode 8. On the other hand, the base portion of the N-type source layer 4 corresponding to the back of the comb forms an MOSFET together with the gate electrode 6.

In the embodiment shown in FIG. 11, the slender portions, i.e., the teeth portions of the comb, of the N-type source layer 4 act as a resistor. In other words, a resistor is provided between the source electrode 8 and the MOSFET so as to stabilize the operation of the MOSFET. Further, the comb-shaped N-type source layer 4 is smaller in area than the ordinary striped source layer, making it possible to set the latch-up current at a high value.

Figure 12:
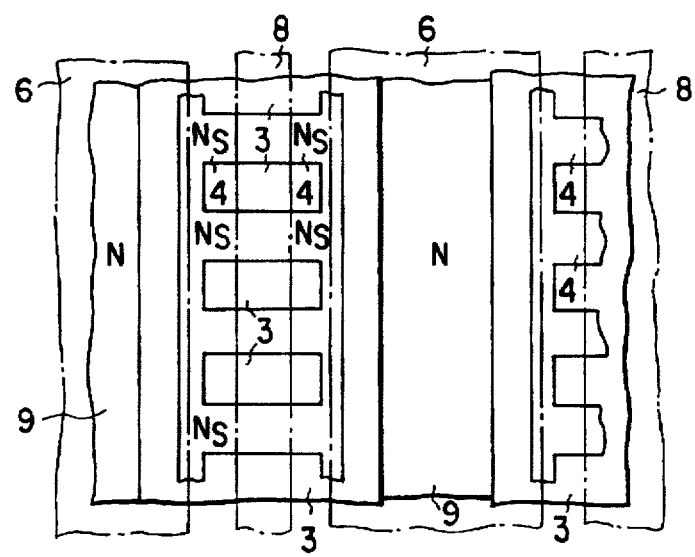
FIG. 12 is a plan view showing a gist part of a power semiconductor device according to still another embodiment of the present invention.

FIG. 12 is a plan view showing a gist part, i.e., an IGBT area, of a power semiconductor device according to still another embodiment of the present invention.

The embodiment shown in FIG. 12 differs from the embodiment of FIG. 11 in that, in FIG. 12, the N-type source layer 4 is formed in a ladder shape. It should be noted the N-type source layer 4 formed in a ladder shape also causes the latch-up current to be a high value, as in the embodiment of FIG. 11. What should also be noted is that, since the N-type source layer 4 extends across the source electrode 8, the contact between the N-type source layer 4 and the source electrode 8 can be ensured more reliably than in the embodiment of FIG. 11. Further, in the embodiment of FIG. 12, the width of the source electrode 8 is made narrower, and the distance $L_S$ between adjacent gate electrodes is made shorter, with the result that the element region is effectively utilized.

Figure 13:
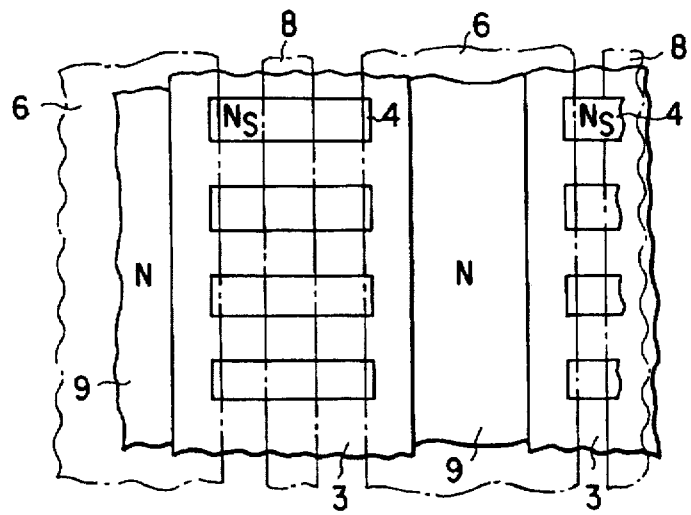
FIG. 13 is a plan view showing a gist part of a power semiconductor device according to still another embodiment of the present invention.

FIG. 13 is a plan view showing a gist part, i.e., an IGBT area, of a power semiconductor device according to still another embodiment of the present invention.

The embodiment shown in FIG. 13 differs from the embodiment of FIG. 12 in that, in FIG. 13, a plurality of N-type source layers 4, which are formed as independent islands, are arranged to form the steps of a ladder. The particular arrangement of the N-type source layers 4 also causes the latch-up current to be a high value, as in the embodiment shown in FIG. 12. Further, since the distance $L_S$ between adjacent gate electrodes 6 can be diminished, the element region can be effectively utilized.

Figure 14:
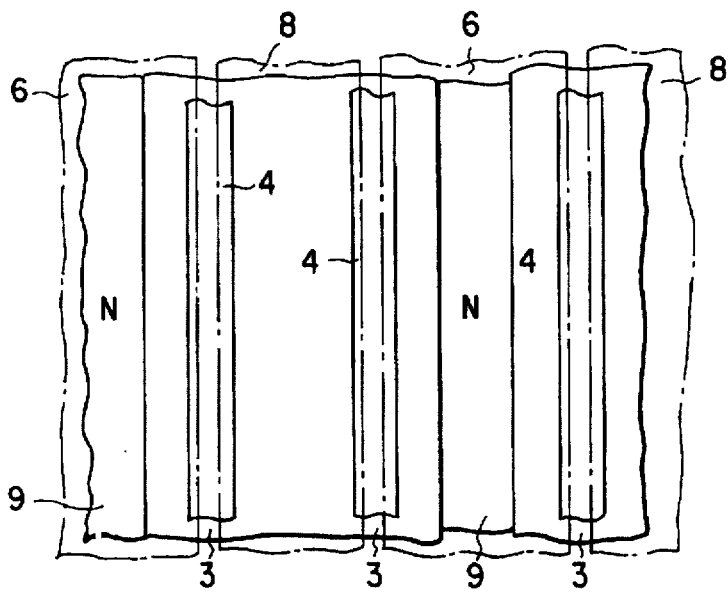
FIG. 14 is a plan view showing a gist part of a power semiconductor device according to still another embodiment of the present invention.

FIG. 14 is a plan view showing a gist part, i.e., an IGBT area, of a power semiconductor device according to still another embodiment of the present invention.

The embodiment shown in FIG. 14 differs from the embodiment of FIG. 11 in that, in FIG. 14, the N-type source layer 4 is formed in the shape of a very fine stripe by utilizing a fine processing technology, i.e., fine dry etching technology which has been developed recently. Since the width of the N-type source layer is very small, the embodiment of FIG. 14 also causes the latch-up current to be a high value, though the N-type layer 4 is formed in a stripe shape.

Figure 15:
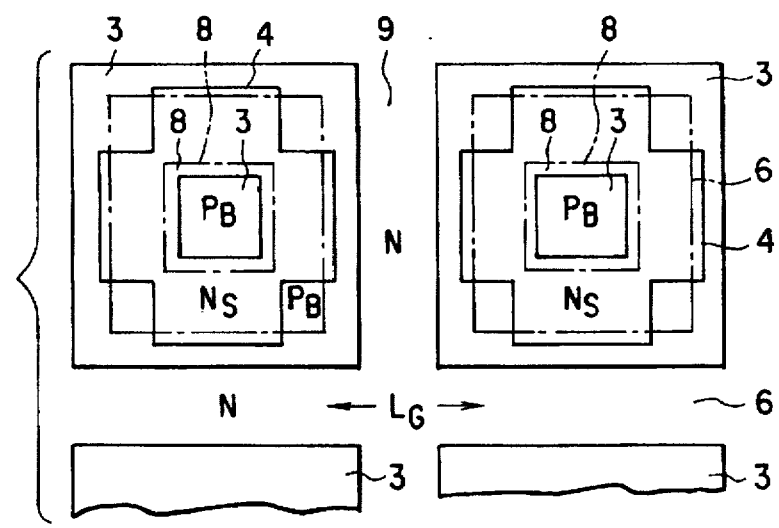
FIG. 15 is a plan view showing a gist part of a power semiconductor device according to still another embodiment of the present invention.

FIG. 15 is a plan view showing a gist part, i.e., an IGBT area, of a power semiconductor device according to still another embodiment of the present invention.

The embodiment of FIG. 15 is featured in that a plurality of P-type base layers 3, which are formed as independent islands, are periodically arranged in a matrix format. As shown in the drawing, the N-type source layer 4 is formed in a cross-shape so as to hardly cause latch-up, with an opening provided in the central portion thereof. The source electrode 8 is in contact with the P-type base layer 3 through the opening in the central portion of the N-type source layer 4. The particular layout makes it possible to increase the degree of integration of the semiconductor device and, at the same time, to improve the conducting properties.

Figure 16:
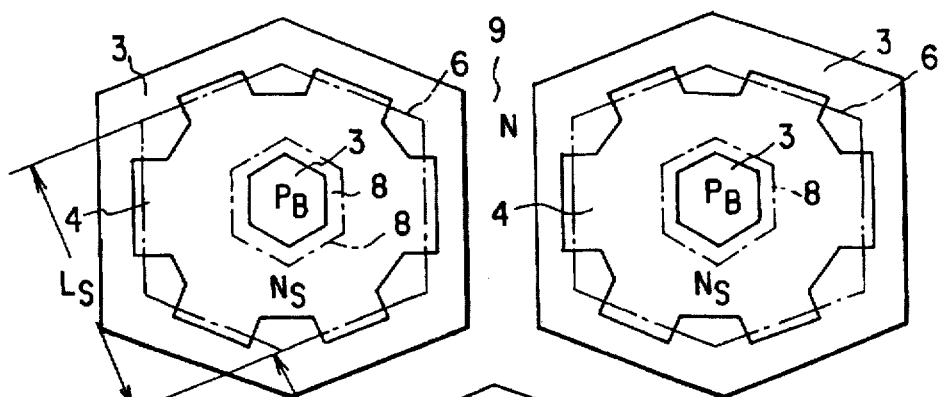
FIG. 16 is a plan view showing a gist part of a power semiconductor device according to still another embodiment of the present invention.

FIG. 16 is a plan view showing a gist part, i.e., an IGBT area, of a power semiconductor device according to still another embodiment of the present invention.

The embodiment of FIG. 16 is featured in that a plurality of P-type base layers 3, which are formed as independent hexagonal islands, are periodically arranged in a matrix format. As shown in the drawing, the N-type source layer 4 is formed in a star-shape so as to hardly cause latch-up, with an opening provided in the central portion thereof. The source electrode 8 is in contact with the P-type base layer 3 through the opening in the central portion of the N-type source layer 4. The particular layout makes it possible to increase the degree of integration of the semiconductor device and, at the same time, to improve the conducting properties.

Figure 17:
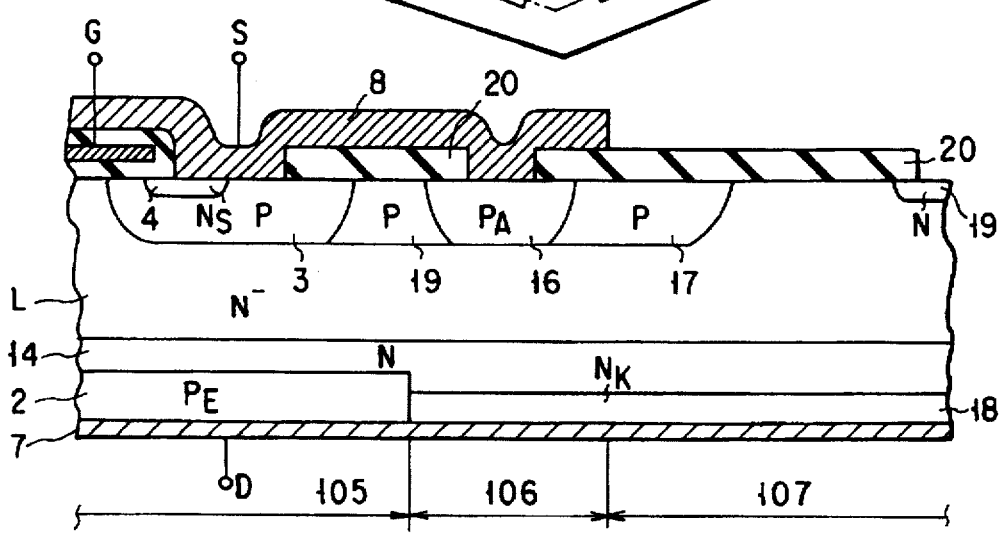
FIG. 17 is a cross sectional view showing a gist part of a power semiconductor device according to still another embodiment of the present invention.
Figure 18:
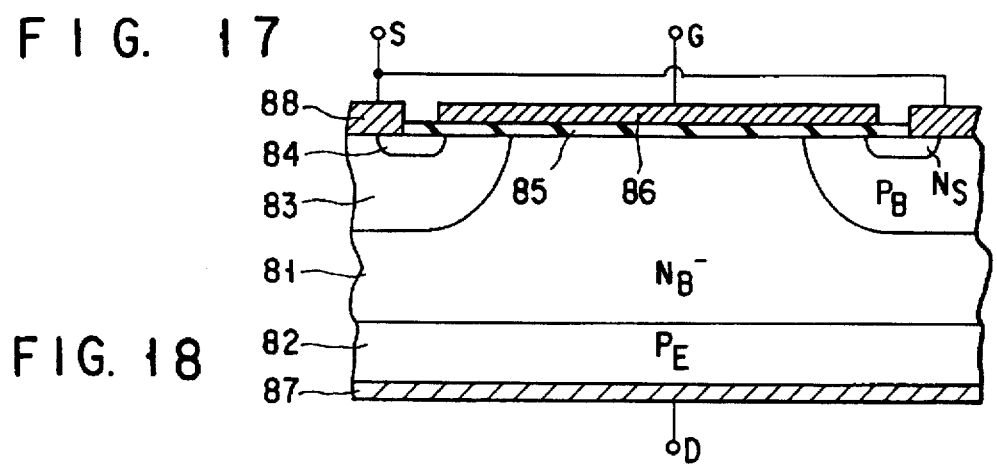
FIG. 18 is a cross sectional view showing a conventional IGBT.

Further, FIG. 17 is a plan view showing a gist part of a power semiconductor device according to still another embodiment of the present invention.

The embodiment shown in FIG. 17 comprises an IGBT 105 according to an embodiment of the present invention, a free wheel diode 106 positioned adjacent the IGBT 105, and a junction terminal portion 107. This embodiment decreases the inductance and capacitance caused by the wiring, because the switching element 105 and the diode 106 are formed simultaneously within the same substrate, with the result that the switching can be performed at a high speed and with a high stability.

The diode 106 comprises P-type anode layer 16 and N-type cathode layer 18 which are connected to the source electrode 8 and the drain electrode 7, respectively. The P-type anode layer 16 is connected to the N-type cathode layer 18 through the N-type layer 1 of a high resistivity and the N-type buffer layer 14 of a low resistivity.

At the end portion of the junction terminal portion 107, an N-type stopper layer 19 is formed by an impurity diffusion in a surface of the N-type layer 1. Further, an insulating film 20 is formed to cover the surface of the junction terminal portion 107 starting from the P-type anode layer 16 and ending in the N-type stopper layer 19.

It is necessary to provide a sufficient distance between the IGBT 105 and the diode 106. Specifically, the distance between the two should be at least equal to the carrier diffusion length. As a result, the electric field tends to be concentrated on the surface of the region between the IGBT 105 and the diode 106 so as to lower the withstand voltage. In order to overcome the difficulty, a P-type diffusion layer 17 of a high resistivity is formed between the P-type base layer 3 of the IGBT 105 and the P-type anode layer 16 of the diode 106. This P-type diffusion layer 17 can be formed simultaneously with formation of a P-type diffusion layer 17 of the junction terminal portion 107, making it unnecessary to employ an additional process step.

It is desirable to set the total impurity concentration within the P-type diffusion layers 17 at $1 \times 10^{14}$ $cm^{-2}$ or lower. In this case, the withstand voltage at the junction terminal portion 107 can be maintained satisfactory. Also, the IGBT 105 and the diode 106 can be separated from each other sufficiently.

As described above, the present invention makes it possible to provide a power semiconductor device exhibiting excellent conducting properties by means of optimum designs in terms of the construction and impurity concentration. Particularly, the present invention permits providing a power semiconductor device which can be controlled by an MOS drive under the withstand voltage of at least 3 kV at which a GTO (Gate Turn-Off Thyristor) is utilized nowadays.

Although, a parasitic thyristor structure is included in the power semiconductor device of the present invention, the device is not latched up in the present invention and exhibits a strong resistance to destruction. As a result, the device of the present invention permits simplifying the protecting circuit, compared with the GTO. Also, since the gate circuit and the protecting circuit can be simplified in the present invention, compared with the GTO, it is possible to diminish the system size in the present invention. Where, for example, an inverter device is prepared, the system size can be made about a half of the size in the conventional system. Further, since the device of the present invention is of a planar type, the current lead-out portion can be formed easily, making it possible to incorporate the device of the present invention in various packages.

Specifically, the present invention permits decreasing the on-voltage, enlarging the safe operation range, and setting a high latch-up current of the power semiconductor device by employing a design meeting conditions of 60 $\mu m \leq L_G$, $5 \leq L_G/L_S$ and $1 \leq L_G^2/(D_B \cdot D_B) \leq 9$.

What should also be noted is that a high mobility semiconductor layer is formed in the present invention in a surface of a base layer of a first conductivity type which is sandwiched between a base layer of a second conductivity type and a source layer of the second conductivity type. The particular construction permits increasing the amount of the carrier injected per unit time into the base layer of the first conductivity type so as to increase the carrier injection efficiency and to lower the on-voltage of the power semiconductor device.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power semiconductor device having a plurality of circuit elements arranged side by side, each circuit element comprising:

an emitter layer of a first conductivity type;

a base layer of a second conductivity type arranged on said emitter layer;

a base layer of the first conductivity type formed in a surface of said base layer of the second conductivity type;

a source layer of the second conductivity type formed in a surface of said base layer of the first conductivity type;

a gate insulating film formed over at least the base layer of the first conductivity type located between the source layer of the second conductivity type and the base layer of the second conductivity type;

a gate electrode portion arranged on the gate insulating film extending over at least the base layer of the first conductivity type located between said source layer of the second conductivity type and said base layer of the second conductivity type;

a source electrode portion arranged to be in contact with both said source layer of the second conductivity type and said base layer of the first conductivity type;

a drain electrode portion arranged to be in contact with said emitter layer of the first conductivity type; and wherein each said gate electrode portion of at least an adjacent first pair of two of said circuit elements together comprise an integral gate electrode satisfying conditions of 60 $\mu m \leq L_G/L_S$ and $1 \leq L_G^2/(D_B \cdot W_B) \leq 9$, where $L_G$ denotes a width of said integral gate electrode, $D_B$ denotes a depth of said base layer of the first conductivity type, $W_B$ denotes a thickness of said base layer of the second conductivity type which is located between said base layer of the first conductivity type and said emitter layer of the first conductivity type, and $L_S$ denotes a distance between one integral gate electrode and an adjacent integral gate electrode.

2. The power semiconductor device according to claim 1, further comprising:

a low resistivity semiconductor layer of the second conductivity type formed in said base layer of the second conductivity type, said gate electrode portion extending over said low resistivity semiconductor layer.

3. The power semiconductor device according to claim 2, wherein said low resistivity semiconductor layer of the second conductivity type has a peak value of impurity concentration of at least $3 \times 10^{14}$ cm$^{-3}$.

4. The power semiconductor device according to claim 3, wherein said second conductivity type is N-type and said low resistivity semiconductor layer of the second conductivity type has a peak value of impurity concentration of at least $1 \times 10^{15}$ cm$^{-3}$.

5. The power semiconductor device according to claim 2, wherein said low resistivity semiconductor layer of the second conductivity type has a depth at least half the depth of said base layer of the first conductivity type.

6. The power semiconductor device according to claim 5, wherein said low resistivity semiconductor layer of the second conductivity type has a depth substantially equal to the depth of said base layer of the first conductivity type.

7. The power semiconductor device according to claim 2, wherein said low resistivity semiconductor layer of the second conductivity type is formed in said base layer of the second conductivity type below said integral gate electrode.

8. The power semiconductor device according to claim 2, wherein said low resistivity semiconductor layer of the second conductivity type is formed in said base layer of the second conductivity type located only in a region positioned adjacent to said base layer of the first conductivity type.

9. The power semiconductor device according to claim 1, further comprising:

a central insulating film portion positioned below a central portion of said integral gate electrode and formed integrally with said gate insulating film, said central insulating film portion having a thickness greater than the thickness of said gate insulating film.

10. The power semiconductor device according to claim 1, further comprising:

a metal electrode formed on at least a part of the integral gate electrode.

11. The power semiconductor device according to claim 1, wherein a part of said base layer of the second conductivity type is in contact with the drain electrode.

12. The power semiconductor device according to claim 1, further comprising:

a life-time lowering layer formed within said base layer of the second conductivity type near a boundary between said emitter layer of the first conductivity type and said base layer of the second conductivity type.

13. The power semiconductor device according to claim 1, further comprising:

a low resistivity buffer layer of the second conductivity type formed between said emitter layer of the first conductivity type and said base layer of the second conductivity type.

14. The power semiconductor device according to claim 1, wherein each said source electrode portion of a second pair of an adjacent two of said circuit elements together comprise an integral source electrode, wherein the second pair of two adjacent circuit elements sharing the integral source electrode are different from the first pair of two adjacent circuit elements sharing the integral gate electrode.

15. The power semiconductor device according to claim 14, wherein a plurality of band-like integral gate electrodes and a plurality of band-like integral source electrodes are alternately arranged.

16. The power semiconductor device according to claim 14, wherein a plurality of integral island source electrodes are surrounded by a plurality of integral gate electrodes forming a single electrode plate.

17. A power semiconductor device having a plurality of circuit elements arranged side by side, each circuit element comprising:

an emitter layer of a first conductivity type;

a base layer of a second conductivity type arranged on said emitter layer;

a base layer of the first conductivity type formed in a surface of said base layer of the second conductivity type;

a source layer of the second conductivity type formed in a surface of said base layer of the first conductivity type;

a gate insulating film formed over at least the base layer of the first conductivity type located between the source layer of the second conductivity type and the base layer of the second conductivity type;

a gate electrode portion arranged on the gate insulating film extending over at least the base layer of the first conductivity type located between said source layer of the second conductivity type and said base layer of the second conductivity type;

a source electrode portion arranged to be in contact with both said source layer of the second conductivity type and said base layer of the first conductivity type;

a drain electrode portion arranged to be in contact with said emitter layer of the first conductivity type, and a semiconductor layer of a high mobility formed in a surface of said base layer of the first conductivity type and located at least between said base layer of the second conductivity type and said source layer of the second conductivity type, said semiconductor layer of a high mobility being arranged along and in contact with said gate insulating film.

18. The power semiconductor device according to claim 17, wherein each said gate electrode portion of a first pair of an adjacent two of the circuit elements together comprise an integral gate electrode satisfying conditions of $60 \ \mu m \leq L_G$ and $5 \leq L_G/L_S$, where $L_G$ denotes a width of said integral gate electrode, and $L_S$ denotes a distance between one integral gate electrode and an adjacent integral gate electrode.

19. The power semiconductor device according to claim 18, wherein a condition of $1 \leq L_G^2/(D_B \cdot W_B) \leq 9$ is also satisfied, where $D_B$ denotes a depth of said base layer of the first conductivity type, and $W_B$ denotes a thickness of that portion of said base layer of the second conductivity type which is located between said base layer of the first conductivity type and said emitter layer of the first conductivity type.

20. The power semiconductor device according to claim 17, wherein each said source electrode portion of a second pair of an adjacent two of said circuit elements comprise a portion of an integral source electrode, wherein the second pair on two adjacent circuit elements sharing the integral source electrode do not share said integral gate electrode that is shared by a first pair of two different adjacent circuit elements.

21. The power semiconductor device according to claim 17, wherein said semiconductor layer of a high mobility has a portion extending into a surface layer of said base layer of the second conductivity type.

* * * * *